United States Patent
Yonezawa (10) Patent No.: US 7,741,560 B2
(45) Date of Patent: Jun. 22, 2010

(54) CHALCOPYRITE SOLAR CELL

(75) Inventor: Satoshi Yonezawa, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/994,349

(22) PCT Filed: Jul. 3, 2006

(86) PCT No.: PCT/JP2006/313204

§ 371 (c)(1),
(2), (4) Date: Oct. 24, 2008

(87) PCT Pub. No.: WO2007/010735

PCT Pub. Date: Jan. 25, 2007

(65) Prior Publication Data

US 2009/0133749 A1    May 28, 2009

(30) Foreign Application Priority Data

Jul. 22, 2005    (JP) .............................. 2005-212350

(51) Int. Cl.
*H01L 31/00* (2006.01)
(52) U.S. Cl. ....................... 136/264; 136/243
(58) Field of Classification Search .............. None
See application file for complete search history.

(56) References Cited

U.S. PATENT DOCUMENTS 5,676,766 A    10/1997  Probst et al.
5,693,565 A    12/1997  Camilletti et al.
6,127,202 A    10/2000  Kapur et al.
2004/0144419 A1    7/2004  Fix et al.

FOREIGN PATENT DOCUMENTS

| EP | 0 820 097 A1 | 1/1998 |
| EP | 0 978 882 A2 | 2/2000 |
| FR | 2820241 | 8/2002 |
| JP | 61-15763 U | 1/1986 |
| JP | 05-259494 | 10/1993 |
| JP | 05-090751 A | 12/1993 |

(Continued)

OTHER PUBLICATIONS

Machine Translation Brent (JP 11-340482; Dec. 10, 1999), retrieved Jun. 16, 2009.*

(Continued)

*Primary Examiner*—Alexa D Neckel
*Assistant Examiner*—Miriam Berdichevsky
(74) *Attorney, Agent, or Firm*—Carrier, Blackman & Associates P.C.; Joseph P. Carrier; William D. Blackman (57) ABSTRACT

A chalcopyrite solar cell having a mica substrate or a laminated mica substrate, an intermediate layer made of a ceramic-based material formed on the mica substrate, and a binder layer formed on the intermediate layer. The intermediate layer has a thickness equal to or more than 2 μm and equal to or less than 20 μm. The binder layer has a thickness equal to or more than 3000 Å and equal to or less than 8000 Å. The intermediate layer and the binder layer are interposed between the mica substrate and a molybdenum electrode.

1 Claim, 8 Drawing Sheets

FOREIGN PATENT DOCUMENTS

| | | | |
|---|---|---|---|
| JP | 08-125206 | | 5/1996 |
| JP | 08125206 A | * | 5/1996 |
| JP | 9-503346 A | | 3/1997 |
| JP | 10-098042 | | 4/1998 |
| JP | 10200142 A | * | 7/1998 ................. 136/243 |
| JP | 11340482 A | * | 12/1999 |
| JP | 2000-058893 | | 2/2000 |
| JP | 2000-244000 | | 9/2000 |
| JP | 2001-257374 | | 9/2001 |
| JP | 2001-339081 | | 12/2001 |
| JP | 2004-532501 A | | 10/2004 |
| JP | 2005-317728 | | 11/2005 |
| JP | 2006-147759 | | 6/2006 |
| WO | 95/09441 | | 4/1995 |
| WO | 02/065554 A1 | | 8/2002 |
| WO | 2005/106968 A1 | | 11/2005 |

OTHER PUBLICATIONS

Machine Translation Takeshi (JP 08-125206; May 17, 1996), retrieved Jun. 16, 2009.*

* cited by examiner

FIG. 1

PRIOR ART

FIG.4B surface configuration after application of intermediate layer

FIG.5A

Ra=0.1um
maximum height difference =1.5um, Length=300um enlarged surface configuration after application of intermediate layer

FIG.5B

Ra=0.05um
maximum height difference =0.4um, Length=200um

CHALCOPYRITE SOLAR CELL

TECHNICAL FIELD

The present invention relates to a solar cell having a light absorbing layer made of a chalcopyrite compound. In particular, it relates to a solar cell having a substrate made of mica, which is flexible, or a material containing mica.

BACKGROUND ART

Solar cells, which receive light and convert the light into electric energy, are classified into the bulk type and the thin film type according to the thickness of the semiconductor. The thin-film solar cells have a semiconductor layer having a thickness equal to or less than several to several tens of micrometers and are classified into the Si thin film type and the compound thin film type. The compound thin film solar cells are further classified into several types including the II-VI family compound type and the chalcopyrite type, and some compound thin film solar cells have been commercially available. In particular, the chalcopyrite solar cell is referred to also as CIGS (Cu(InGa)Se) thin film solar cell, CIGS solar cell or I-III-VI family solar cell after the material used therefor.

The chalcopyrite solar cell has a light absorbing layer made of a chalcopyrite compound and is characterized by its high efficiency, insusceptibility to deterioration by light (deterioration with age), high radiation resistance, wide light absorption wavelength range, high absorption coefficient and the like. Research and development for the mass production of the chalcopyrite solar cell are now being conducted.

Figure 1:
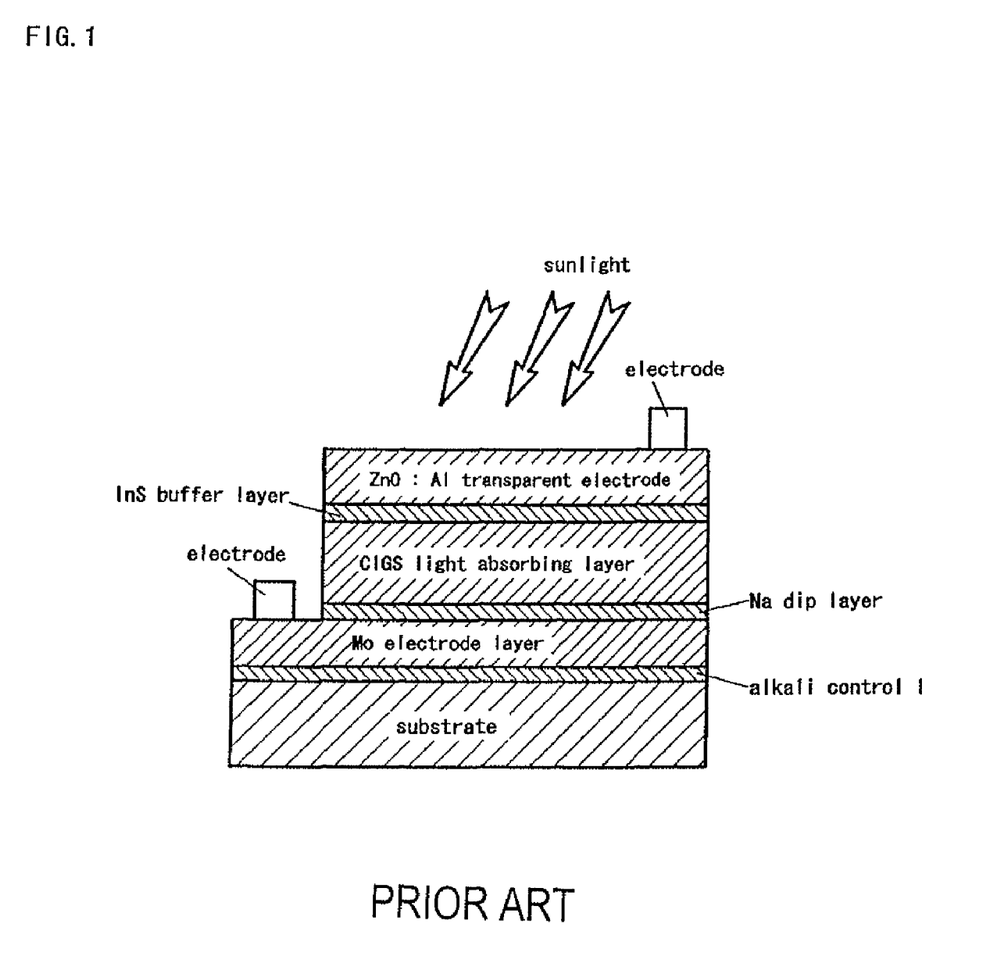
FIG. 1 is a cross-sectional view showing a structure of a conventional chalcopyrite solar cell.

FIG. 1 shows a cross-sectional structure of a typical chalcopyrite solar cell. As shown in FIG. 1, the chalcopyrite solar cell comprises a glass substrate, a lower electrode thin film formed on the glass substrate, a light absorbing layer thin film containing copper, indium, gallium and selenium, a buffer layer thin film formed on the light absorbing layer thin film, and an upper electrode thin film. When the chalcopyrite solar cell is irradiated with light, such as sunlight, electron-hole pairs are generated, and at the interface between the p-type semiconductor and the n-type semiconductor, the electrons (−) move to the n-type semiconductor, and the holes (+) move to the p-type semiconductor. As a result, an electromotive force is generated between the n-type semiconductor and the p-type semiconductor. If leads are connected to the electrodes in this state, a current can be drawn to the outside.

Figure 2:
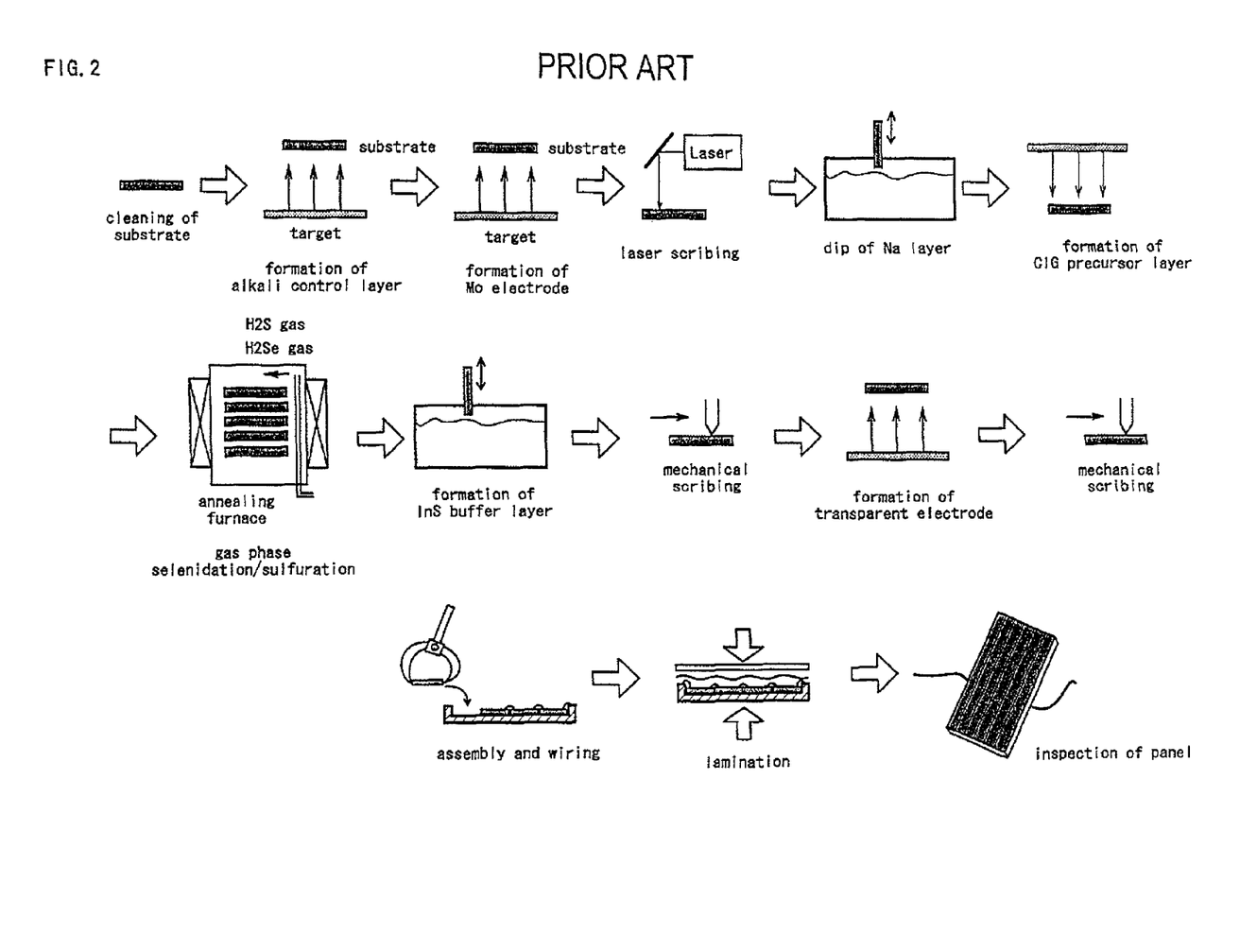
FIG. 2 is a diagram for illustrating a sequence of steps of a process of manufacturing the conventional chalcopyrite solar cell.

FIGS. 2 and 3 are diagrams for illustrating a process of manufacturing a chalcopyrite solar cell. First, a Mo (molybdenum) electrode serving as a lower electrode is formed by sputtering on a glass substrate, such as soda lime glass. Then, as shown in FIG. 3(a), the Mo electrode is split by laser irradiation or the like (first scribing). After the first scribing, shavings are washed away with water or the like, and copper (Cu), indium (In) and gallium (Ga) are deposited on the Mo electrode by sputtering to form a precursor. The precursor is placed in a furnace and annealed in an $H_2Se$ gas atmosphere to form a chalcopyrite light absorbing layer thin film. The annealing step is commonly referred to as gas phase selenidation process or simply as selenidation process.

Figure 3A:
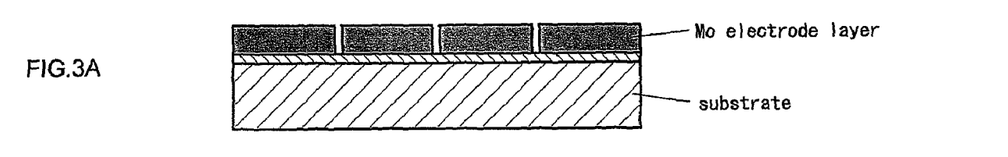
FIGS. 3A-3D include diagrams for illustrating essential steps of the manufacturing process according to an embodiment of the present invention.
Figure 3B:
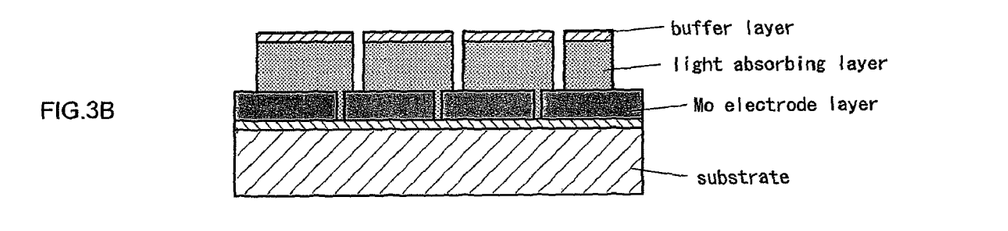

Then, an n-type buffer layer of CdS, ZnO, InS or the like is formed on the light absorbing layer. The buffer layer is typically formed by sputtering or chemical bath deposition (CBD), for example. Then, as shown in FIG. 3(b), the buffer layer and the precursor are split by laser irradiation or with a metal needle, for example (second scribing).

Figure 3C:
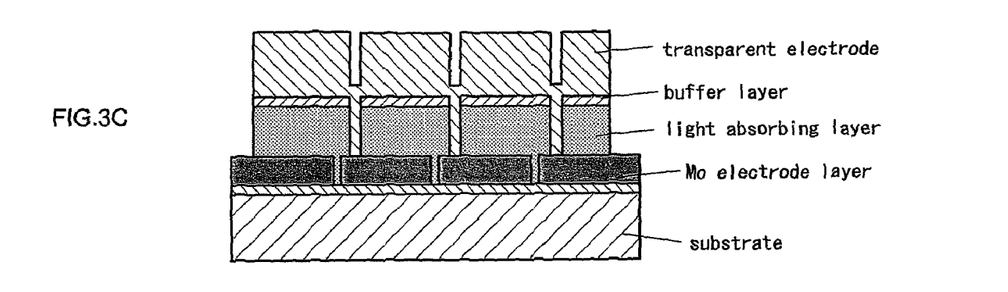
Figure 3D:
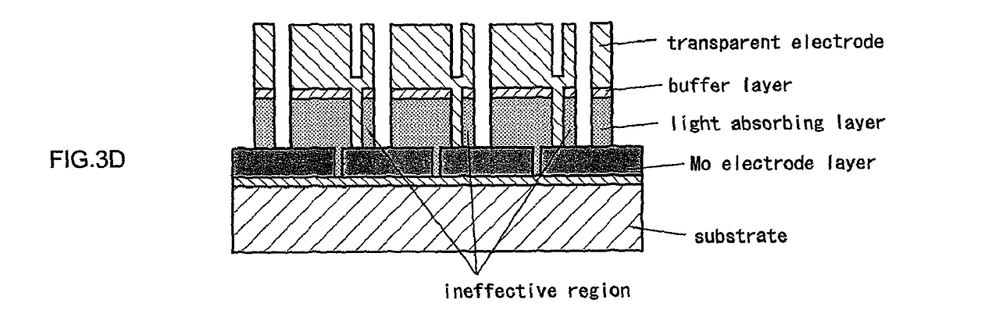

Then, as shown in FIG. 3(c), a transparent electrode (TCO) of ZnOAl or the like serving as an upper electrode is formed by sputtering. Then, as shown in FIG. 3(d), the TCO, the buffer layer and the precursor are split by laser irradiation or with a metal needle, for example (third scribing). In this way, a CIGS thin film solar cell is completed.

The solar cell manufactured as described above is called "cell". In practice, a plurality of cells are grouped into a package and processed as a module (panel). Each scribing step separates the solar cells into a plurality of stages of solar cells arranged in series. Changing the number of the stages can change the voltage of the cells.

Such a conventional chalcopyrite solar cell has a glass substrate. This is because the glass substrate is an insulator, easily available and relatively inexpensive, and has high adhesion to the Mo electrode layer (lower electrode thin film) and a smooth surface. In addition, sodium in glass is advantageously diffused into the light absorbing layer (p layer) to raise the energy conversion efficiency. However, glass has a low melting point, and high annealing temperature cannot be used in the selenidation step, so that the energy conversion efficiency is low. Furthermore, the glass substrate is thick and heavy, so that a large-scale manufacturing facility is needed, and the completed product is inconvenient to handle. Furthermore, the glass substrate can hardly be deformed, a mass production process, such as roll-to-roll process, cannot be used.

In order to overcome the disadvantages, there has been proposed a chalcopyrite solar cell that uses a polymer film substrate (see the patent literature 1, for example). Furthermore, there has been proposed a technique of forming a chalcopyrite solar cell structure on a stainless steel substrate having a silicon oxide or ferric fluoride layer on upper and lower surfaces thereof (see the patent literature 2, for example). Furthermore, there has been proposed a technique using glass, alumina, mica, polyimide, molybdenum, tungsten, nickel, graphite or stainless steel as a chalcopyrite-based substrate material (see the patent literature 3, for example).

Patent literature 1: Japanese Patent Laid-Open No. 5-259494

Patent literature 2: Japanese Patent Laid-Open No. 2001-339081

Patent literature 3: Japanese Patent Laid-Open No. 2000-58893

DISCLOSURE OF THE INVENTION

Among conventional chalcopyrite solar cells using a material other than glass as the substrate material, the chalcopyrite solar cell using polymer film disclosed in the patent literature 1 cannot be processed at a temperature of 260 degrees C. or higher if the polymer is polyimide, for example. Thus, a high-temperature process carried out at a temperature higher than 500 degrees C., such as the gas phase selenidation process, cannot be used, and as a result, a cell having high conversion efficiency cannot be manufactured.

The technique of forming a silicon oxide or ferric fluoride layer (protective layer) on the upper and lower surfaces of a stainless steel substrate disclosed in the patent literature 2 has a disadvantage that the stainless steel substrate cannot be adequately protected against $H_2Se$ gas in the gas phase selenidation step, and a Mo electrode layer (a back-side electrode thin film) peels off the corroded stainless steel substrate. In addition, since the conductive stainless steel substrate is exposed when the protective layer peels off, a scribing step using a metal needle cannot be introduced.

Furthermore, although various kinds of substrate materials are listed in the patent literature 3, all the techniques described as complete examples in the description of the embodiments of the patent literature use a glass substrate, and the other substrate materials listed in the patent literature are not described in detail enough for those skilled in the art to apply those materials to the techniques. For example, in the examples described in the patent literature, the substrate is annealed at temperatures ranging from 385 to 495 degrees C. However, these temperatures are intended only for soda lime glass, and there remains a doubt whether the same process can be applied to the other substrate materials listed in the patent literature.

As described above, the conventional techniques do not use a substrate material that satisfies requirements that the material is a high insulation material, is easily available, is relatively inexpensive and has high adhesion to the Mo electrode layer (lower electrode thin film), a smooth surface, a melting point equal to or higher than 600 degrees C., a small thickness, a light weight and high flexibility.

Thus, the inventors have proposed a solar cell that has high flexibility, is suitable for mass production by the roll-to-roll process, and has high conversion efficiency, which uses mica or a material containing mica as the substrate material to provide high flexibility, has an intermediate layer made of a ceramic material to overcome the low surface smoothness of the substrate made of mica or a material containing mica, and has a chalcopyrite light absorbing layer on the intermediate layer with a binder interposed therebetween.

In addition, the inventors have found that the substrate made of a material containing mica has a disadvantage that the conversion efficiency is reduced because potassium (K) is diffused from the substrate into the light absorbing layer.

In order to overcome the disadvantage described above, a chalcopyrite solar cell according to the present invention comprises: a substrate made of mica or a material containing mica; an intermediate layer that is formed on the substrate, is made of a ceramic-based material, and has a thickness equal to or more than 2 μm and equal to or less than 20 μm; a binder layer that is formed on the intermediate layer, is made of a nitride-based material, such as titanium nitride (TiN) and tantalum nitride (TaN), and has a thickness equal to or more than 3000 Å and equal to or less than 8000 Å; a lower electrode layer formed on the binder layer; a p-type light absorbing layer formed on the lower layer and made of a chalcopyrite compound; an n-type buffer layer formed on the light absorbing layer; and a transparent electrode layer formed on the buffer layer.

According to the present invention, a substrate made of mica or a material primarily containing mica is used. Mica has a high insulating property of $10^{12}$ to $10^{16} \Omega$, a high heat resistance of 800 to 1000 degrees C. and high resistance against acids, alkalis and $H_2Se$ gas. Thus, the gas phase selenidation process can be carried out at an optimal temperature, so that high conversion efficiency can be achieved. If the selenidation process is carried out at a relatively low processing temperature of about 500 degrees C., which is used for soda lime glass substrate, in the process for manufacturing a CIGS solar cell, uncrystallized Ga is segregated on the surface of the light absorbing layer on the side of the lower electrode thin film, and thus, the band gap is reduced, and the current density is lowered. However, if the thermal processing for gas phase selenidation is carried out at a temperature equal to or higher than 600 degrees C. and equal to or lower than 700 degrees C., Ga is uniformly diffused into the light absorbing layer, the band gap is expanded because there is no uncrystallized Ga, and as a result, the open-circuit voltage (Voc) increases. Therefore, if mica or a material primarily containing mica is used as the substrate material, a solar cell having high conversion efficiency can be provided. Furthermore, mica and laminated mica have high flexibility, so that the solar cell can be manufactured by the roll-to-roll process, and therefore, the demand for mass production can be satisfied.

However, it has been found that the surface of the substrate made of mica or laminated mica primarily containing mica is not smooth, and the maximum surface roughness in a range of several tens of micrometers is 5 to 6 μm. The substrate having such a high surface roughness tends to lead to an inadequate surface coating, a leakage, and a decrease of the open-circuit voltage (Voc) of the solar cell, and the sufficient conversion efficiency cannot be achieved. In order to solve the problem, according to the present invention, a thick intermediate layer for providing the substrate with a planar or smooth surface is formed between the mica or laminated mica substrate and the metal electrode. The intermediate layer ensures the conformity among the various layers formed on the substrate to form the solar cell, thereby eliminating the disadvantage that the conversion efficiency is reduced.

The thickness of the intermediate layer is preferably equal to or more than 2 μm from the viewpoint of providing the mica or laminated mica substrate with a planar surface and is equal to or less than 20 μm from the viewpoint of ensuring the flexibility of the substrate. When forming the thick intermediate layer, if an oxide or nitride film is formed by a vacuum processing, such as sputtering, there are disadvantages not only that the film formation takes a long time but also that a crack occurs in the oxide or nitride film in the case where the solar cell is folded or bent and that the flexibility of the substrate is reduced. Thus, according to the present invention, the thick intermediate layer is formed by a non-vacuum processing, such as coating with a brush, spraying, silk printing and spin coating. Using the film forming technique based on the non-vacuum processing facilitates formation of the intermediate layer having a desired thickness.

Furthermore, according to the present invention, a binder layer made of a nitride-based compound, such as TiN and TaN, is interposed between the intermediate layer formed on the mica or laminated mica substrate and the molybdenum electrode formed thereon. The binder layer serves as a barrier for suppressing diffusion of impurities and has high adhesion to molybdenum or the like. The thickness of the binder layer is equal to or more than 3000 Å and equal to or less than 8000 Å because the binder layer having a thickness less than 3000 Å cannot adequately prevent diffusion of potassium from the mica substrate into the light absorbing layer compared with the conventional glass substrate, and the binder layer having a thickness more than 8000 Å is degraded in flexibility and is likely to peel off.

A solar cell according to a preferred embodiment of the present invention has a substrate made of laminated mica, which is manufactured by mixing mica powder with a resin and rolling and burning the mixture. Although the laminated mica has a lower heat resistance than pure mica because the laminated mica contains the resin, the laminated mica has a heat resistant temperature of 600 to 800 degrees C. and therefore can be processed at a temperature of 600 to 700 degrees C., which is the optimal temperature for the gas phase selenidation process. In addition, the laminated mica has high flexibility and therefore is suitable for the roll-to-roll process. In addition, the laminated mica substrate is significantly inexpensive compared with the glass substrate. Therefore, using the laminated mica for the substrate allows a solar cell suitable for mass production and having high conversion efficiency to be manufactured at lower cost.

In addition, a smoothing layer made of a silicon-based material, such as SiN and $SiO_2$, may be formed on the surface of the intermediate layer. In this case, the intermediate layer made of a ceramic-based material can be provided with a smooth surface, so that the adhesion of the intermediate layer to the binder layer can be improved.

According to the present invention, a mica substrate or laminated mica substrate is coated with a ceramic-based material (an intermediate layer) having a predetermined thickness, and a chalcopyrite light absorbing layer is formed on the intermediate layer with a binder layer made of a nitride-based material having a predetermined thickness interposed therebetween. Thus, there can be provided a chalcopyrite solar cell that prevents diffusion of impurities (in particular, potassium) from the substrate into the light absorbing layer, is lightweight, and has high flexibility and high conversion efficiency.

The binder made of a nitride-based material is relatively expensive in itself. In addition, the inexpensive ceramic-based material used for the intermediate layer allows reduction of the thickness of the binder layer. Thus, compared with the conventional chalcopyrite solar cell having a glass substrate, the chalcopyrite solar cell according to the present invention can be manufactured at low cost.

BEST MODE FOR CARRYING OUT THE INVENTION

Figure 4A:
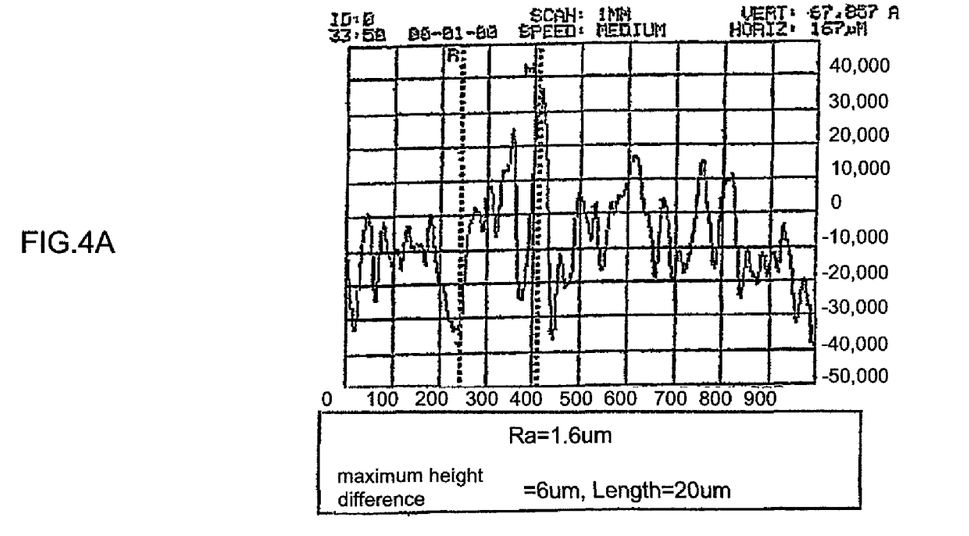
FIGS. 4A-4B include graphs for illustrating the surface configuration of a laminated mica substrate according to an embodiment of the present invention.
Figure 4B:
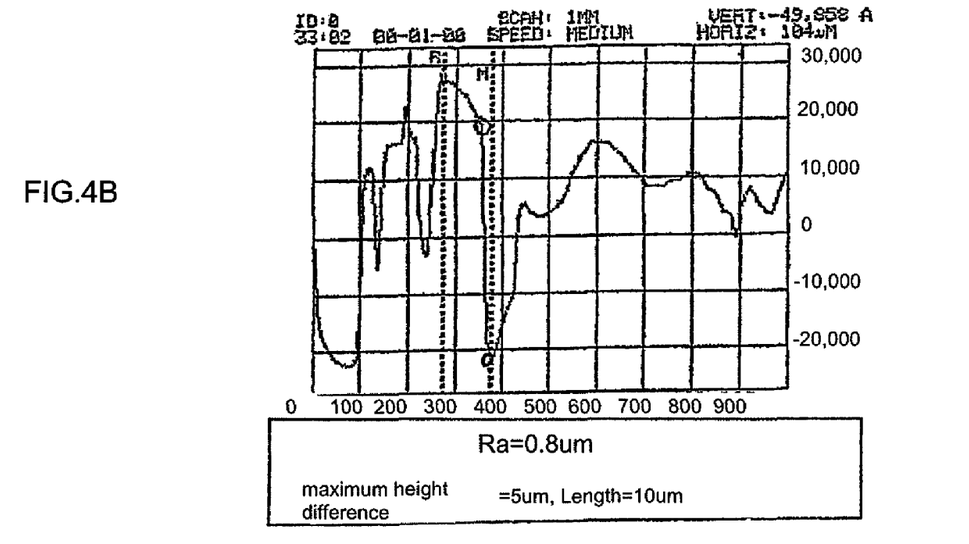

Prior to describing an embodiment of the present invention, a surface configuration of a laminated mica substrate will be described. FIGS. 4(A) and 4(B) show results of measurement of the surface configuration of a laminated mica substrate at arbitrary two points. In FIGS. 4(A), 4(B), the abscissa indicates the horizontal position in the laminated mica substrate, and the ordinate indicates the vertical position. The laminated mica substrate is characterized in that the height varies very steeply, and the maximum height difference is large (in other words, the aspect ratio is high). As is apparent from FIGS. 4(A), 4(B), there is a maximum height difference of 5 to 6 μm in a horizontal range of several tens of micrometers. It can be considered that the large height difference is due to the method of manufacturing the laminated mica. Specifically, the laminated mica is manufactured by mixing pieces of pulverized mica with a resin. The pieces of pulverized mica exist on the surface and thus result in the extremely high aspect ratio. The surface roughness Ra of the laminated mica substrate is 1.6 μm and 0.8 μm at the two points of measurement, respectively. With such a surface condition, if an electrode of Mo or the like is deposited directly on the substrate, and a light absorbing layer is formed thereon, the surface is not adequately coated, and a leakage occurs, so that the performance of the solar cell is significantly degraded. Specifically, the open-circuit voltage (Voc) of the solar cell is reduced, and the conversion efficiency is reduced.

Figure 5A:
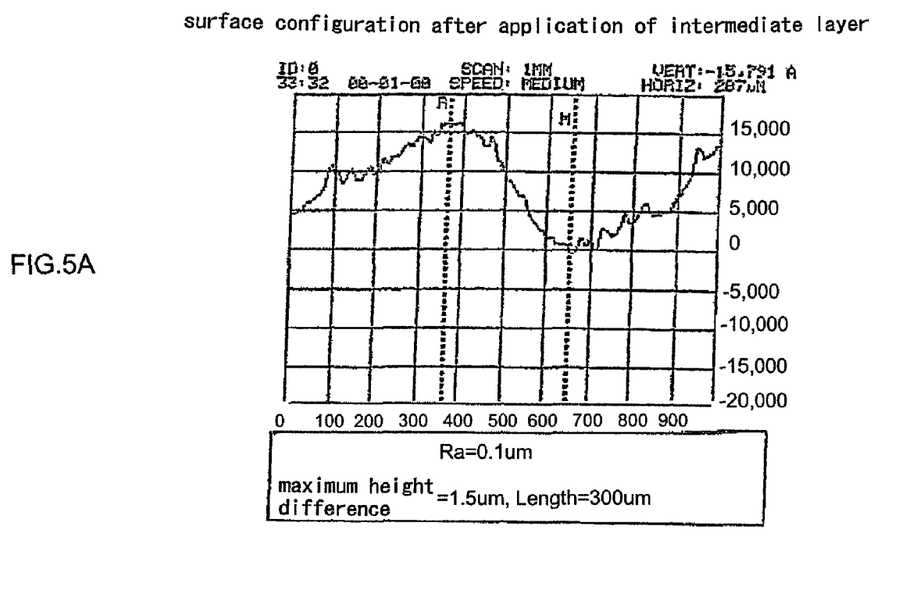
FIGS. 5(A) and 5(B) are graphs for illustrating the surface configuration of the laminated mica substrate with a thick intermediate layer formed on the surface thereof according to an embodiment of the present invention.
Figure 5B:
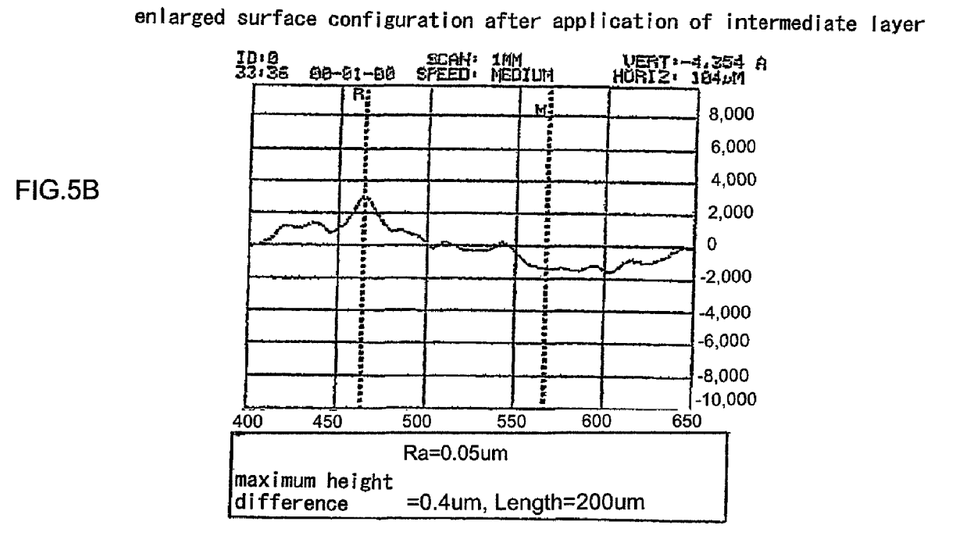

FIGS. 5(A) and 5(B) show results of measurement of the surface configuration of the laminated mica substrate coated with an 8-μm-thick ceramic-based paint, which is the same material as an intermediate layer. FIGS. 5(A), 5(B) show the results of measurement at arbitrary two points. As is apparent from FIGS. 5(A), 5(B), the maximum height difference of 5 to 6 μm in the range of several micrometers, which is observed in the measurement of the surface configuration of the laminated mica substrate, disappears, although the general undulation inherent to the substrate is still measured. Thus, from the results of measurement shown in FIGS. 4(A), 4(B) and 5(A), 5(B), it can be concluded that the adequate thickness of the intermediate layer is 2 μm or more and preferably 5 μm.

Figure 6:
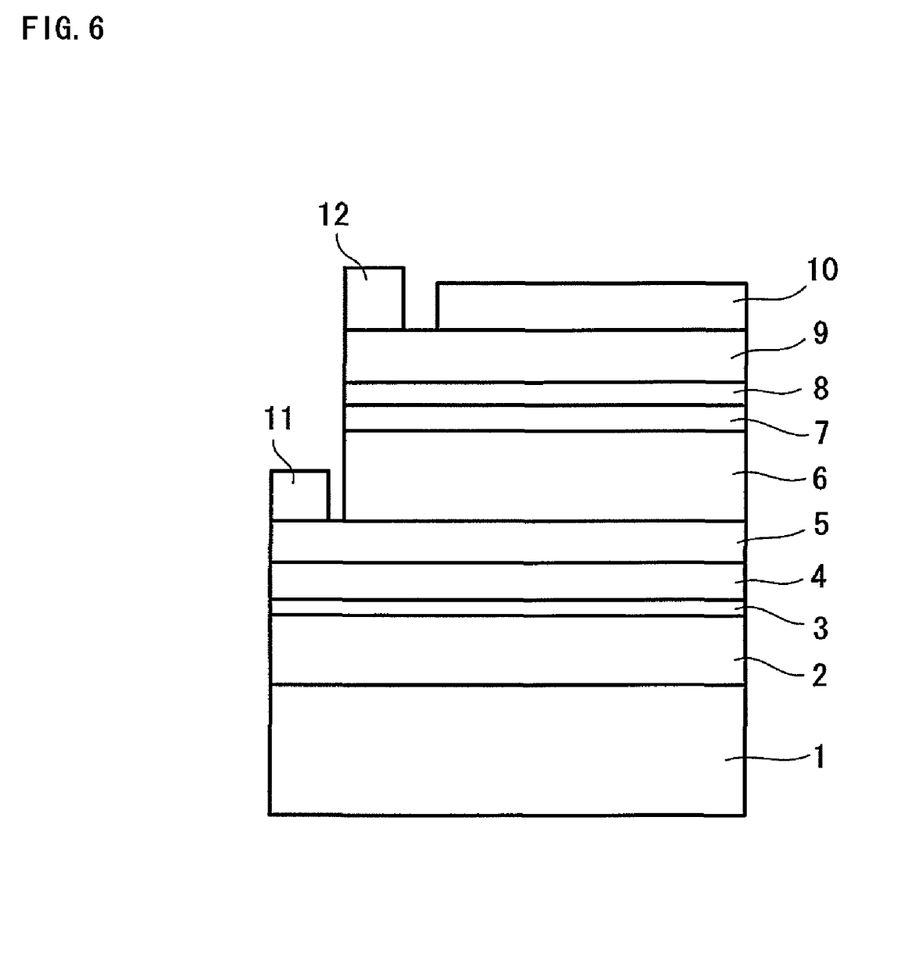
FIG. 6 is a cross-sectional view showing the structure of an example of a solar cell according to an embodiment of the present invention.

FIG. 6 is a cross-sectional view showing a structure of an example of a solar cell according to the present invention. In this example, a laminated mica substrate 1 is used as the substrate. The laminated mica is a high-insulation material that is manufactured by mixing mica powder with a resin and rolling and burning the mixture. The laminated mica has a heat resistant temperature of about 600 to 800 degrees C., which is higher than the heat resistant temperature (500 to 550 degrees C.) of soda lime glass, which is used in conventional solar cells. Since the optimal processing temperature of the gas phase selenidation process is 600 to 700 degrees C., a chalcopyrite light absorbing layer can also be formed at an optimal temperature. In addition, the laminated mica is highly flexible and therefore suitable for the roll-to-roll manufacturing process.

A thick intermediate layer 2 is formed on the laminated mica substrate 1. The intermediate layer 2 is intended to provide the laminated mica substrate with a planar or smooth surface and has a thickness of 2 to 20 μm. The intermediate layer 2 is made of a ceramic-based material. For example, the intermediate layer 2 may be a paint containing 39 weight percent of titanium, 28.8 weight percent of oxygen, 25.7 weight percent of silicon, 2.7 weight percent of carbon and 1.6 weight percent of aluminum. For example, the thick intermediate layer 2 may be formed by forming a paint film by coating with a brush, spraying, silk printing, spin coating or the like and then drying and burning the paint film. The thickness of the intermediate layer 2 has to be equal to or more than 2 μm in order to provide the laminated mica with a planar surface and has to be equal to or less than 20 μm in order to ensure the flexibility of the finished solar cell. The ceramic-based paint material forming the intermediate layer is primarily made of an inorganic resin manufactured by the sol-gel process, contains silicon and oxygen strongly ionically bonded, and has a heat resistant temperature of about 1200 degrees C. Therefore, the ceramic-based paint material is adequately resistant to the ideal processing temperature of the gas phase selenidation process for forming the chalcopyrite light absorbing layer described later.

The ceramic-based material coating the substrate surface increases the open-circuit voltage "Voc" and improves the filter factor (FF) value, resulting in higher conversion efficiency. For conventional laminated mica substrates, high surface smoothness cannot be achieved because the surface smoothing layer and the binder layer cannot conform to the surface of the laminated mica substrate that steeply changes in height, or in other words, the oxide film or nitride film cannot fill the deep recesses in the surface of the laminated mica substrate.

The surface can be smoothed by forming a thicker oxide film (nitride film) by extra sputtering. However, in this case, there is a possibility that the oxide film (nitride film) cracks and damages a lower electrode layer or a light-absorbing layer when the solar cell is bent. Thus, the flexibility, which is an advantage of the laminated mica substrate, is spoiled. Furthermore, sputtering is costly and therefore is not suitable for mass production.

Then, a surface smoothing layer 3 is formed on the intermediate layer 2. The surface smoothing layer 3 may be made of SiN or $SiO_2$ and is formed by a dry process, such as sputtering. The Si-based material is used because the material can provide the intermediate layer 2 with a smoother surface and improve the adhesion between the underlying intermediate layer made of the ceramic-based material and a binder layer described later. The surface smoothing layer 3 is formed as required and can be omitted.

A binder layer 4 is formed on the surface smoothing layer 3. The binder layer 4 is intended to prevent diffusion of an impurity or a constituent of the underlying mica substrate and intermediate layer and improve the adhesion between a metal electrode 5 made of molybdenum, tungsten or the like formed thereon and the mica substrate structure (including the mica substrate 1 and the intermediate layer 2). The binder layer 4 is preferably made of a nitride compound, such as TiN and TaN. According to an experimental result, in order to adequately serve as a barrier, the thickness of the binder layer 4 has to be equal to or more than 3000 Å. Although a thicker binder layer is preferred in order to serve as an effective barrier and improve the adhesion, a binder layer having a thickness greater than 10000 Å is easy to peel off. Therefore, the thickness of the binder layer should be equal to or less than 8000 Å.

Layers are formed on the binder layer 4 as with the conventional chalcopyrite solar cell. Specifically, first, a molybdenum (Mo) electrode 5, which serves as a lower electrode, is formed by sputtering, and the Mo electrode 5 is split by laser irradiation (first scribing).

Then, copper (Cu), indium (In) and gallium (Ga) are deposited by sputtering or the like to form a precursor, the precursor is placed in a furnace, and a chalcopyrite light absorbing layer 6 is formed by the gas phase selenidation process, which involves annealing in an $H_2Se$ gas atmosphere. As required, a step of adding sodium (Na), which is an alkali metal, can be performed in advance of the gas phase selenidation process. Na diffused into the light absorbing layer promotes grain growth in the light absorbing layer, resulting in higher energy conversion efficiency.

The light absorbing layer 6 is a p-type semiconductor layer, and an n-type buffer layer 7, which serves as an n-type semiconductor layer of CdS, ZnO, InS or the like, is formed to a thickness of several hundreds Å, for example, by sputtering, chemical bath deposition (CBD) or the like. As required, a high resistance layer 8 having a thickness of several hundreds Å can be formed on the n-type buffer layer 7. Then, the light absorbing layer and the buffer layer are split by laser irradiation or with a metal needle (second scribing).

Then, a transparent electrode (TCO) 9 made of ZnOAl or the like, which serves as an upper electrode, is formed by sputtering, CBD or the like, and an antireflection film 10 is formed thereon. Then, the antireflection film, the transparent electrode, the binder layer and the light absorbing layer are split by laser irradiation or with a metal needle (third scribing). Then, leading electrodes 11 and 12 are formed on the lower electrode layer 5 and the upper electrode layer 9, respectively. In this way, a chalcopyrite thin-film solar cell is completed.

In the step of forming molybdenum electrode 5 and the following steps, if the wet processing, such as CBD, is replaced with a dry processing, the roll-to-roll process, in which the solar cell is manufactured from a roll of laminated mica substrate, can be introduced. When using the roll-to-roll process, the step of forming the intermediate layer made of the ceramic-based material can be previously performed on the laminated mica substrate or incorporated into the role-to-role process.

Figure 7:
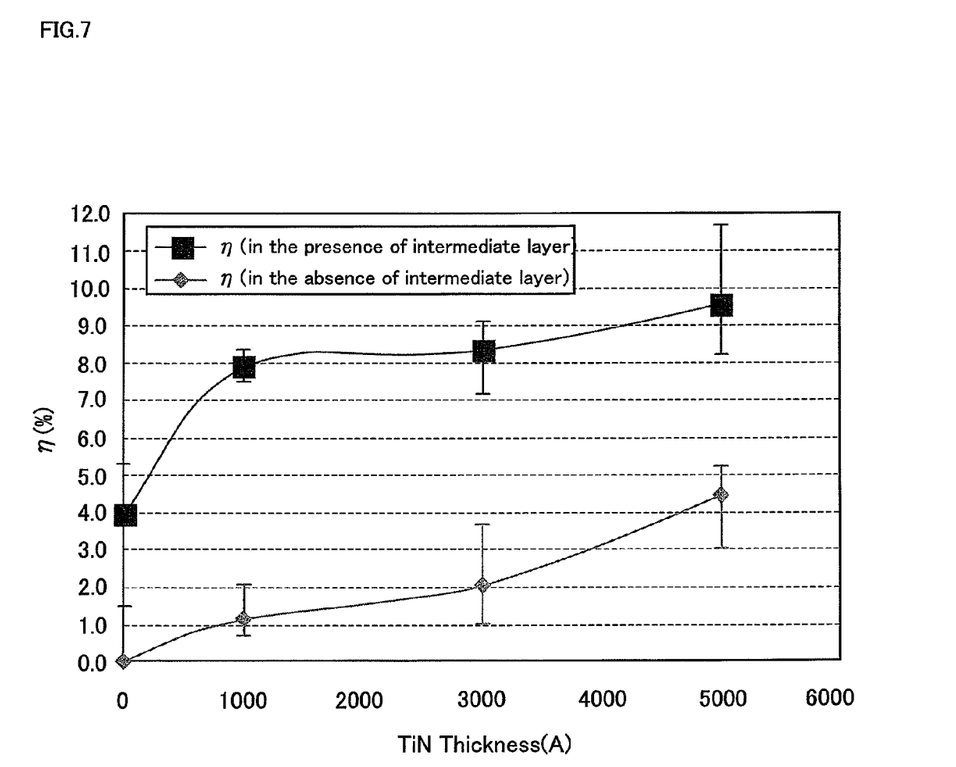
FIG. 7 is a graph showing the conversion efficiency versus the thickness of a binder layer.

FIG. 7 is a graph showing the conversion efficiency of the binder layer versus the thickness thereof. From the graph, it can be seen that in the absence of the binder layer, the conversion efficiency of the solar cell having the intermediate layer is about 4% higher than that of the solar cell having no intermediate layer, and in the presence of the binder layer having a thickness of 1000 Å, the conversion efficiency of the solar cell having the intermediate layer is less than 7% higher than that of the solar cell having no intermediate layer.

Thus, it can be considered that the intermediate layer enhances the effect of the binder layer. In addition, in the presence of the intermediate layer, the binder layer is effective even if the layer is thin. Thus, in the presence of the intermediate layer, the binder layer can be thinner.

Figure 8A:
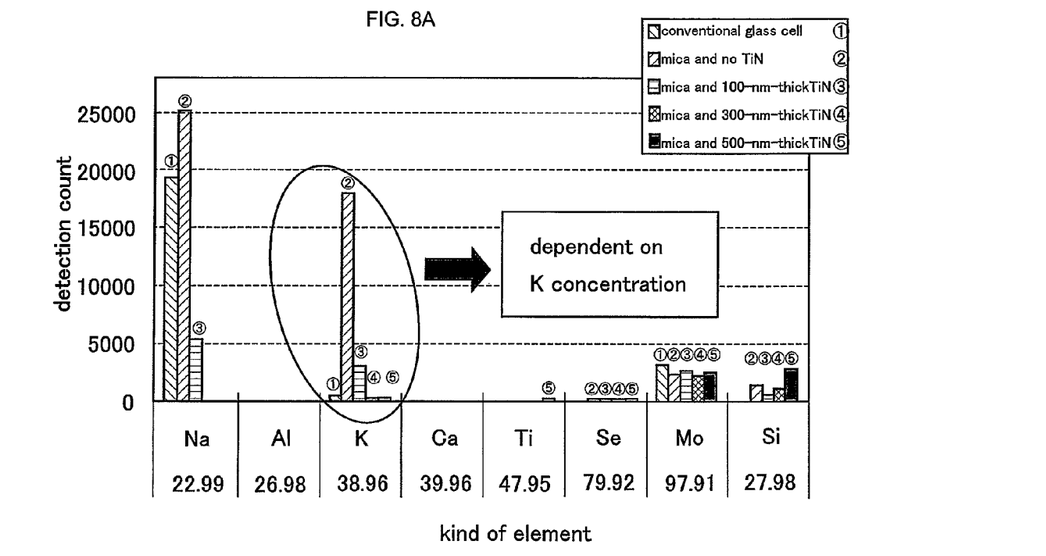
FIG. 8(A) is a graph showing several kinds of elements diffused into a light absorbing layer and their respective detection counts for different thicknesses of the binder layer including a case where the thickness is zero (there is no binder layer)
Figure 8B:
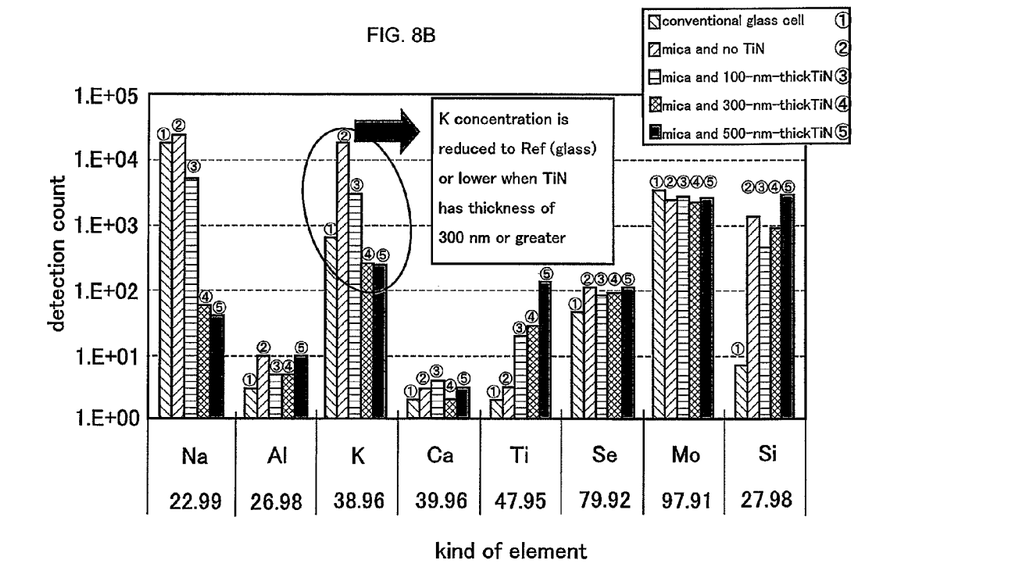
FIG. 8(B) is a graph showing the detection counts in FIG. 8(A) in a logarithmic scale.

FIGS. 8(A), 8(B) show results of examination of the thickness dependency of the effect of the binder layer. FIGS. 8(A), 8(B) show the count of diffused impurities measured by the time-of-flight secondary ion mass spectrometry after gas phase selenidation process in the case where a coating of a ceramic-based material, which serves as the intermediate layer, is formed on the laminated mica substrate, and the binder layer is formed between the intermediate layer and the Mo electrode. FIG. 8(A) is a graph showing the detection count in a linear scale, and FIG. 8(B) is a graph showing the detection count in FIG. 8(A) in a logarithmic scale.

From the graph of FIG. 8(A), it can be seen that an impurity element that affects the conversion efficiency of the solar cell is potassium (K), and diffusion of potassium (K) depends on the thickness of the binder layer. From the graph of FIG. 8(B), it can be seen that, to make the potassium (K) concentration lower than that in the case where a glass substrate is used, the thickness of the binder layer has to be equal to or more than 300 nm (3000 Å).

The invention claimed is:

1. A method for manufacturing a chalcopyrite solar cell, comprising the steps of:

preparing a substrate made of mica or a material containing mica, and forming an intermediate layer made of a ceramic-based material and having a thickness equal to or more than 2 μm and equal to or less than 20 μm on said substrate for providing said substrate with a planar surface;

forming a binder layer containing titanium nitride (TiN) or tantalum nitride (TaN) and having a thickness equal to or more than 3000 Å and equal to or less than 8000 Å on said intermediate layer;

forming a metal lower electrode layer on said binder layer;

forming a precursor containing copper (Cu), indium (In) and gallium (Ga) on said metal lower electrode layer;

forming a p-type light absorbing layer made of a chalcopyrite compound on said metal lower electrode layer by adding selenium (Se) to said precursor and carrying out thermal processing at a temperature equal to or higher than 600 degrees C. and equal to or lower than 700 degrees C.;

forming an n-type buffer layer on said light absorbing layer; and forming a transparent electrode layer on said buffer layer.

* * * * *